United States Patent
Anthony et al.

(10) Patent No.: US 7,102,921 B2
(45) Date of Patent: Sep. 5, 2006

(54) MAGNETIC MEMORY DEVICE

(75) Inventors: Thomas C. Anthony, Sunnyvale, CA (US); Frederick A. Perner, Santa Barbara, CA (US); Heon Lee, Seoul (KR); Robert G Walmsley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 141 days.

(21) Appl. No.: 10/843,787

(22) Filed: May 11, 2004

(65) Prior Publication Data

US 2005/0254292 A1   Nov. 17, 2005

(51) Int. Cl.
    *G11C 11/14*   (2006.01)
(52) U.S. Cl. ....................... 365/171; 365/158
(58) Field of Classification Search ................ 365/171, 365/158, 173
    See application file for complete search history.

(56) References Cited

U.S. PATENT DOCUMENTS

| | | | |
|---|---|---|---|
| 5,224,068 A | 6/1993 | Miyake et al. | |
| 5,396,455 A | 3/1995 | Brady et al. | |
| 5,444,651 A | 8/1995 | Yamamoto et al. | |
| 5,640,343 A | 6/1997 | Gallagher et al. | |
| 5,761,110 A | 6/1998 | Irrinki et al. | |
| 5,933,365 A | 8/1999 | Klersy et al. | |
| 5,936,882 A | 8/1999 | Dunn | |
| 5,953,245 A | 9/1999 | Nishimura | |
| 5,956,295 A | 9/1999 | Yamakawa et al. | |
| 6,016,290 A | 1/2000 | Chen et al. | |
| 6,130,835 A | 10/2000 | Scheuerlein | |
| 6,188,615 B1 | 2/2001 | Perner et al. | |
| 6,385,082 B1 | 5/2002 | Abraham et al. | |
| 6,404,674 B1 | 6/2002 | Anthony et al. | |
| 6,456,525 B1 | 9/2002 | Perner et al. | |
| 6,552,926 B1 | 4/2003 | Komori | |
| 6,555,858 B1 | 4/2003 | Jones et al. | |
| 6,577,549 B1 | 6/2003 | Tran et al. | |
| 6,603,678 B1 | 8/2003 | Nickel et al. | |
| 6,611,453 B1 | 8/2003 | Ning | |
| 6,661,688 B1 | 12/2003 | Bloomquist, deceased et al. | |
| 6,724,674 B1* | 4/2004 | Abraham et al. ........... | 365/211 |
| 6,744,651 B1 | 6/2004 | Tang | |
| 6,771,534 B1* | 8/2004 | Stipe ........................ | 365/158 |
| 6,807,086 B1 | 10/2004 | Kajiyama | |
| 6,819,586 B1 | 11/2004 | Anthony et al. | |
| 6,839,271 B1 | 1/2005 | Anthony et al. | |
| 6,870,759 B1 | 3/2005 | Tsang | |
| 6,911,685 B1 | 6/2005 | Anthony et al. | |
| 6,925,003 B1 | 8/2005 | Tran et al. | |
| 6,937,506 B1 | 8/2005 | Anthony et al. | |
| 6,950,335 B1* | 9/2005 | Dieny et al. ................ | 365/171 |
| 2002/0089874 A1 | 7/2002 | Nickel et al. | |
| 2003/0042562 A1 | 3/2003 | Giebler et al. | |
| 2003/0123282 A1 | 7/2003 | Nickel et al. | |
| 2003/0198113 A1 | 10/2003 | Abraham et al. | |
| 2005/0094456 A1* | 5/2005 | Lee et al. ................... | 365/213 |
| 2005/0180202 A1* | 8/2005 | Huai et al. .................. | 365/171 |

\* cited by examiner

*Primary Examiner*—Anh Phung

(57) ABSTRACT

The present invention provides a magnetic memory device that includes a magnetic memory cell switchable between two states by the application of a magnetic field wherein the magnetic field for such switching is dependent in part on a memory cell temperature. The device further includes at least one heater element proximate to the magnetic memory cell and series connected with the magnetic memory cell for heating of the magnetic memory cell. The device also includes a circuit for selectively applying the electrical current through the at least one heater element so as to heat the cell and facilitate cell state-switching.

25 Claims, 5 Drawing Sheets

MAGNETIC MEMORY DEVICE

FIELD OF THE INVENTION

The present invention relates to magnetic memory devices, and more specifically to a magnetic random access memory (MRAM) device.

BACKGROUND OF THE INVENTION

Non-volatile magnetic random access memory (MRAM) devices have the potential to replace volatile dynamic random access memory (DRAM) devices and static random access memory (SRAM) devices in some applications. The MRAM devices include arrays of memory cells such as tunneling magneto-resistance (TMR), colossal magneto-resistance (CMR), and giant magneto-resistance (GMR) memory cells.

MRAM cells typically include "data" and "reference" layers. The data layer includes a writeable magnetic material, and the reference layer includes a fixed magnetic material. A dielectric layer in between the two has greater or lesser resistance to electrical current depending on whether the magnetic fields from the sandwiching layers are canceling or reinforcing one another.

During a write operation, the magnetization of the data layer can be switched between two opposite states by applying an electro-magnetic field through a nearby wire loop. Thus binary information can be stored. The reference layer usually includes a magnetic material in which the magnetization is pinned. A magnetic field applied to the data layer penetrates the reference layer with insufficient strength to switch the magnetization in the reference layer.

For example, in a TMR cell, the data layer and the reference layer are separated by a thin dielectric layer so that a tunneling junction is formed. The probability that electrons will be able to tunnel through the dielectric layer depends on the direction of the magnetization in the data layer relative to the direction of the magnetization in the reference layer. Therefore, the structure is "magneto-resistant" and information can be stored and retrieved by reading the magnitude of tunneling currents thereafter able to pass through the memory cell.

In general, the magnetic memory cells should be as small as possible. However, the smaller the cells are made, the more sensitive they are to thermal stability problems during operation. In order to compensate, the small magnetic memory cell data layers are fabricated with magnetic material that is more resistant to magnetic change. Unfortunately, generating the stronger fields necessary makes switching the memory cells more difficult during the write operation. Hence, there is a need for a magnetic memory device that addresses these concerns.

SUMMARY OF THE INVENTION

Briefly, a magnetic random access memory (MRAM) device embodiment of the present invention includes a magnetic memory cell switchable between two states by the application of a magnetic field. The magnetic field is dependent in part on a memory cell temperature. The device further includes at least one heater element proximate to the magnetic memory cell and series connected with the magnetic memory cell for heating of the magnetic memory cell. The device also includes a circuit for selectively applying the electrical current through the at least one heater element so as to heat the cell and facilitate cell state-switching.

The invention will be more fully understood from the following description of embodiments of the memory device. The description is provided with reference to the accompanying drawings.

DETAILED DESCRIPTION OF EMBODIMENTS

Figure 1:
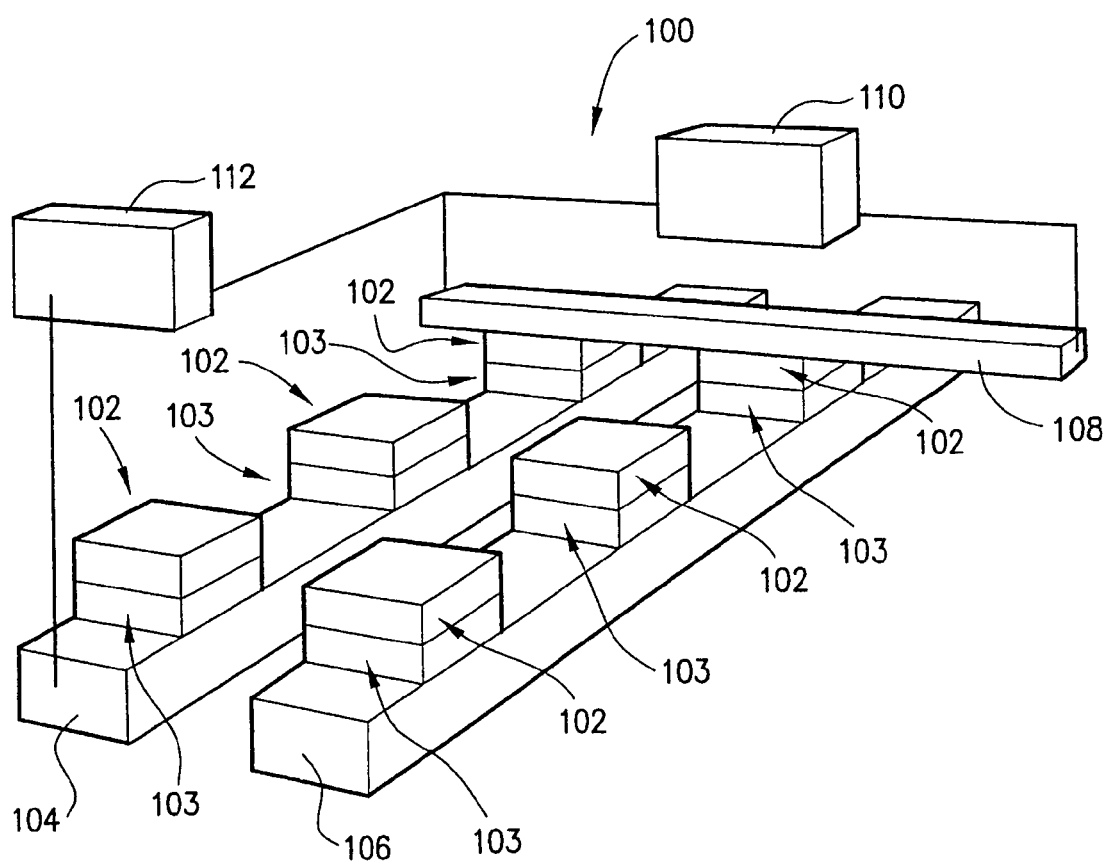
FIG. 1 is a perspective diagram of a magnetic memory device in accordance with an embodiment of the present invention.

Referring initially to FIG. 1, a magnetic random access memory (MRAM) embodiment is now described. The MRAM 100 includes a number of individual magneto-resistance memory (TMR) memory cells 102 and electrical heaters 103 connected in series. Each cell 102 is electrically connected and addressable by word and bit lines. For example, between word lines 104, 106, and bit line 108. For clarity only one bit line 108 is shown in FIG. 1.

When a current is applied along bit line 108, a magnetic field will surround the bit line 108 which can be utilized to switch the magnetization of the memory cells 102. During switching the heaters 103 generate heat which lowers the magnetic field strength for switching the memory cells 102 and thus heating facilitates switching of the memory cells.

FIG. 1 schematically indicates a circuit unit 110 that generates a voltage potential between the ends of bit line 108. The circuit unit 110 may also generate a voltage potential along word lines 104 and 106. For clarity, electrical connections to the circuit unit 110 are not shown for word lines 104 and 106. Alternatively, the word lines 104 and 106 may be grounded. As the magnetic memory cells 102 have a finite resistivity, a current will also flow between bit line 108 and word lines 104 and 108 through respective magnetic memory cells 102.

The device 100 also includes a control circuitry 112 for selectively applying an electrical current through the heaters so as to heat the cell and facilitate cell state-switching. For clarity, only one connection of the control circuitry 112 to the word line 104 and bit line 108 is shown.

MRAM 100 further includes a read circuit for sensing the resistance of selected memory cells 102 during read operations. During read operations, a constant supply voltage or a ground potential is applied to the bit line 108. The constant supply voltage may be provided by an external circuit. The read circuit is not shown in order to simplify the description.

In general there are three methods of applying the potential to the magnetic memory cell 102 to determine the tunneling currents and therefore to sense the resistance state of the selected memory cells 102. A first method uses a current source, voltage follower and comparator to determine the resistance state of a selected memory cell. A second method uses current sense amplifier and a voltage source to detect the resistance state of a selected memory cell. A third method uses a direct injection charge amplifier to apply an equal potential to MRAM 100 during a read operation on a selected memory cell 102.

MRAM 100 may also include an array having any number of memory cells 102 arranged in any number of rows and columns. It can also use alternative technologies such as colossal magneto-resistance memory cells (CMR), and giant magneto-resistance memory (GMR) cells.

Figure 2:
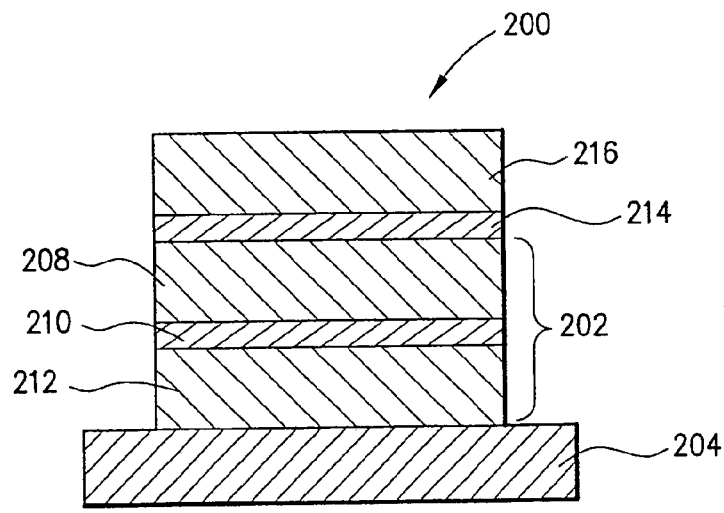
FIG. 2 is a schematic cross-sectional diagram of a magnetic memory device according to an embodiment.

FIG. 2 shows a cross-sectional diagram of the memory cell 202 contacted by the word line 204. The memory cell 202 includes a data layer 208, a thin dielectric layer 210 and a reference layer 212. In general, the magnetization in the data layer 208 of MRAM 200 can have two opposing directions so that binary information can be stored as a function of the direction of the magnetic field generated by the current applied to bit line 216.

The reference layer 212 has a magnetic material in which the direction of magnetization can be pinned. The data layer 208 uses a magnetic material with a direction of magnetization that can be switched as a function of an applied magnetic field.

The dielectric layer 210 is thin enough so that a tunneling current will flow through the dielectric layer when a suitable electrical potential is applied. The tunneling probability, and therefore the effective resistance of the memory cell, depends on the direction of the magnetization in the data layer 210 relative to that of the reference layer 208. Therefore, it is possible to magnetically store and electrically read data by sensing the magnetic orientation in the data layer from the resistance of the memory cell 102 to the tunneling current.

In this embodiment a further dielectric layer 214 is positioned between the data-layer 208 and the bit line 216. The dielectric layer 214 is thin enough so that, when a potential is applied between the word line 204 and the bit line 216 a tunneling current will flow through the dielectric layer 214 resulting in generation of heat. The heat diffuses at least in part into the data layer 208. Due to the heat, the magnetic field strength for switching the magnetization of the data layer 208 is lower and thus heating of the data layer 208 facilitates switching of the magnetization.

The dielectric layer 214 may have a thickness ranging from 0.5 to 10 nm and may be composed of any suitable dielectric material including for example aluminum oxide ($Al_2O_3$), aluminum nitride (AlN), silicon dioxide ($SiO_2$), silicon nitride ($Si_3N_4$) and magnesium oxide (MgO).

In this particular example the data layer 208 is composed of nickel iron (NiFe), the reference layer 212 is composed of cobalt iron (CoFe) and the dielectric layers 210 and 214 are composed of $Al_2O_3$. All layers have the same planar area of approximately 150 nm×300 nm, and the reference layer 212, the data layer 208 and the dielectric layers 210 and 214 have a thickness of approximately 2 nm, 3.5 nm, 1.2 nm, and 1.2 nm, respectively. The resistance of the magnetic memory cell 202 (including contact resistances) is approximately 100 kOhms which in this embodiment equals approximately that of the resistance added to the device due to the presence of the additional tunneling junction at dielectric layer 214. Therefore, the device includes two heat sources that develop approximately the same amount of heat.

Figure 3:
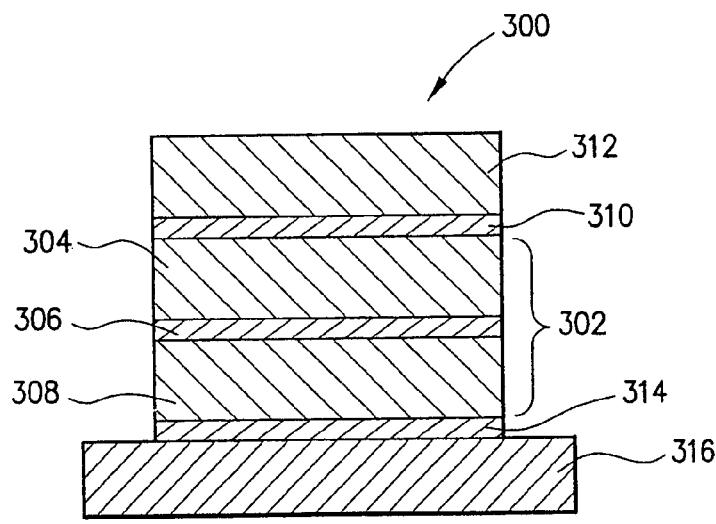
FIG. 3 is a schematic cross-sectional diagram of a magnetic memory device according to an embodiment.

FIG. 3 shows another embodiment which relates to the embodiment shown in FIG. 2. FIG. 3 shows a portion of magnetic memory device 300 including magnetic memory cell 302 having data layer 304, dielectric layer 306 and reference layer 308. Analogous to the device shown in FIG. 2, a dielectric layer 310 is sandwiched between data layer 304 and bit line 312. In this case the device 300 includes a third dielectric layer 314 positioned between reference layer 308 and word line 316 which forms further tunneling junction. Layer 310 and layer 314 have, in this embodiment, identical properties. Therefore, the device shown in this FIG. 3 has a total of three tunneling junctions at dielectric layers 306, 310 and 314. In this embodiment the three heat sources deliver an approximately equal amount of heat but alternatively the device may also be such that each heat-source delivers a different amount of heat.

Figure 4:
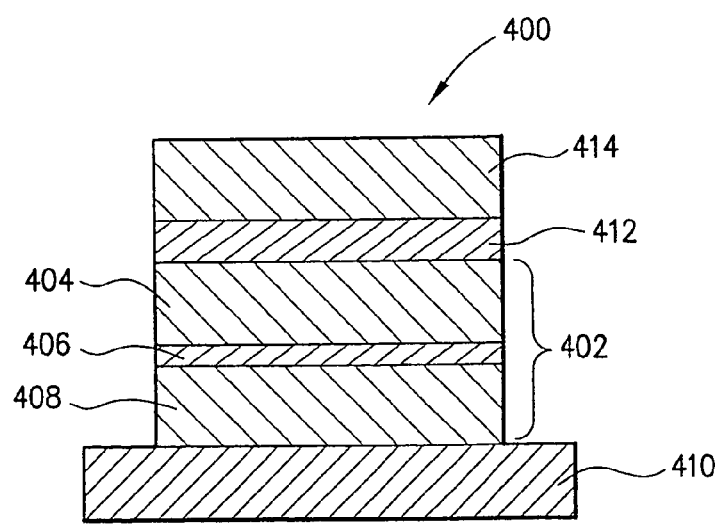
FIG. 4 is a schematic cross-sectional diagram of a magnetic memory device according to an embodiment.

FIG. 4 shows a cross-sectional representation of a portion of device 400. Magnetic memory cell 402 includes data layer 404, dielectric layer 406 and reference layer 408. The magnetic memory cell 402 is contacted by word line 410. In this embodiment a resistive layer 412 is positioned between the data-layer 404 and the bit line 414. When a potential is applied between the word line 410 and the bit line 414 a current will flow through the layer 412 resulting in generation of heat. Therefore, the shown device has two heat sources—the tunneling junction at dielectric layer 406 and the resistive layer 412.

Exemplary materials for the resistive layer 412 include semiconductors (e.g., Si, Ge, Se, C, SiC), oxides (e.g., $HfO_2$, $ZrO_2$, AlO), silicides (e.g., TaSi, WSi, TiSi), nitrides (e.g., TaN, TiN, TaSiN, WN, WSiN). For resistive layers including oxides, silicides and nitrides, the composition of the material may be adjusted to tailor the resistivity, but in this case the layer 412 is composed of amorphous silicon. The resistance of the resistive layer 412 depends on the thickness of the layer and its planar area. In this example the layer 412 has an area of approximately 150×300 nm and a thickness of about 20 nm. In this example the resultant resistance is of layer 412 is 100 kOhm.

In general, the heat-inducing layers 214 and 412 are selected so that the heat-induced by each layer may be 50% to 100% of that generated by the magnetic memory cell. Alternatively, the layer is selected so that the heat induced by the layer is greater than that generated by the magnetic memory cell. In this case each heat-inducing layer may have more than 50% of the design resistance of the magnetic memory cell and typically has more than 100% of the design resistance of the magnetic memory cell.

For example, the memory cell and each heat-inducing layer may have a resistance of 1 kOhm to 1 MOhm and a voltage of 2V may be applied across a series connection of the magnetic memory cell and the heat-inducing layer.

In the embodiments shown in FIGS. 2 and 4 the heat-inducing layers 214 and 412 are in contact with the memory cell. Alternatively, at least one additional layer of insulating or conductive material may be disposed between each heat-inducting layer and the magnetic memory cell.

Figure 5:
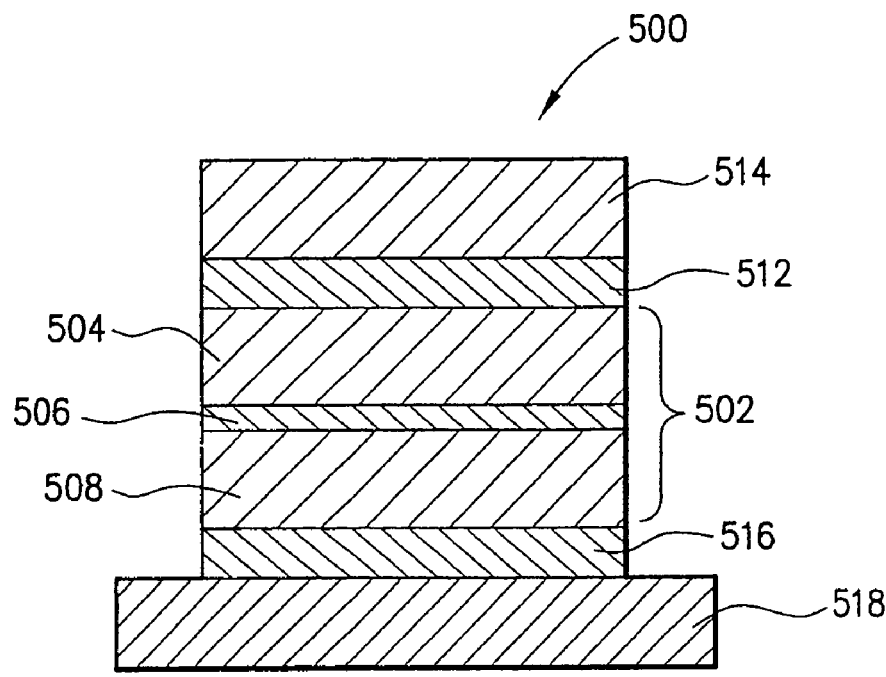
FIG. 5 is a schematic cross-sectional diagram of a magnetic memory devices according to another embodiment.

FIG. 5 shows another embodiment which relates to the embodiment shown in FIG. 4. FIG. 5 shows a cross-sectional representation a portion of device 500. Magnetic memory cell 502 includes data layer 504, dielectric layer 506 and reference layer 508. The magnetic memory cell 502 is contacted by word line 510. Resistive layer 512 is positioned between the data-layer 504 and the bit line 514. In this case the device 500 includes a further resistive layer 516 positioned between reference layer 508 and word line 518. Resistive layers 512 and 516 are generally identical.

Therefore, the device shown in this Fig. has a total of three heat sources: the tunneling junction at dielectric layer 506 and the resistive layers 512 and 516.

Figure 6:
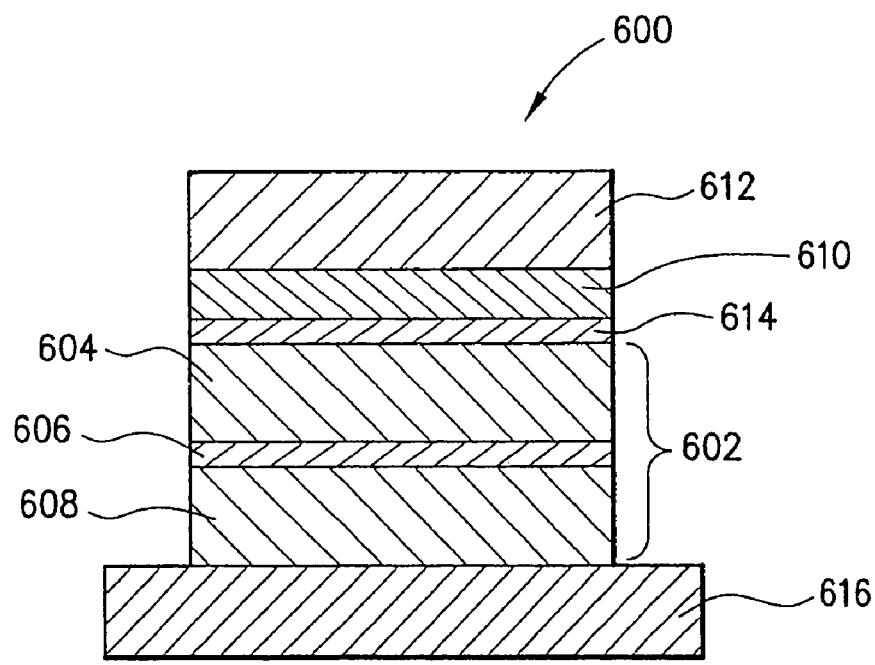
FIG. 6 is a schematic cross-sectional diagram of a magnetic memory device according to a further embodiment.

FIG. 6 shows a combination of the embodiments shown in FIGS. 2 to 3 and 4 to 5. FIG. 6 shows a cross-sectional representation a portion of MRAM 600. Magnetic memory cell 602 includes data layer 604, dielectric layer 606 and reference layer 608. A resistive layer 610 is in contact with the bit line 612 and a dielectric layer 614 is disposed between the resistive layer 612 and the data layer 604. In general, the resistive layer 610 and the dielectric layer 614 correspond in composition and dimensions to resistive layer 512 and dielectric layer 310 shown in FIGS. 5 and 3 respectively. Therefore, the device includes two adjacent heat sources, namely the tunneling junction at dielectric layer 614 and the resistive layer 610 in addition to the tunneling junction at dielectric layer 606. It is to be appreciated that alternatively or additionally a dielectric layer and a resistive layer may be disposed between word line 616 and reference layer 608.

Figure 7:
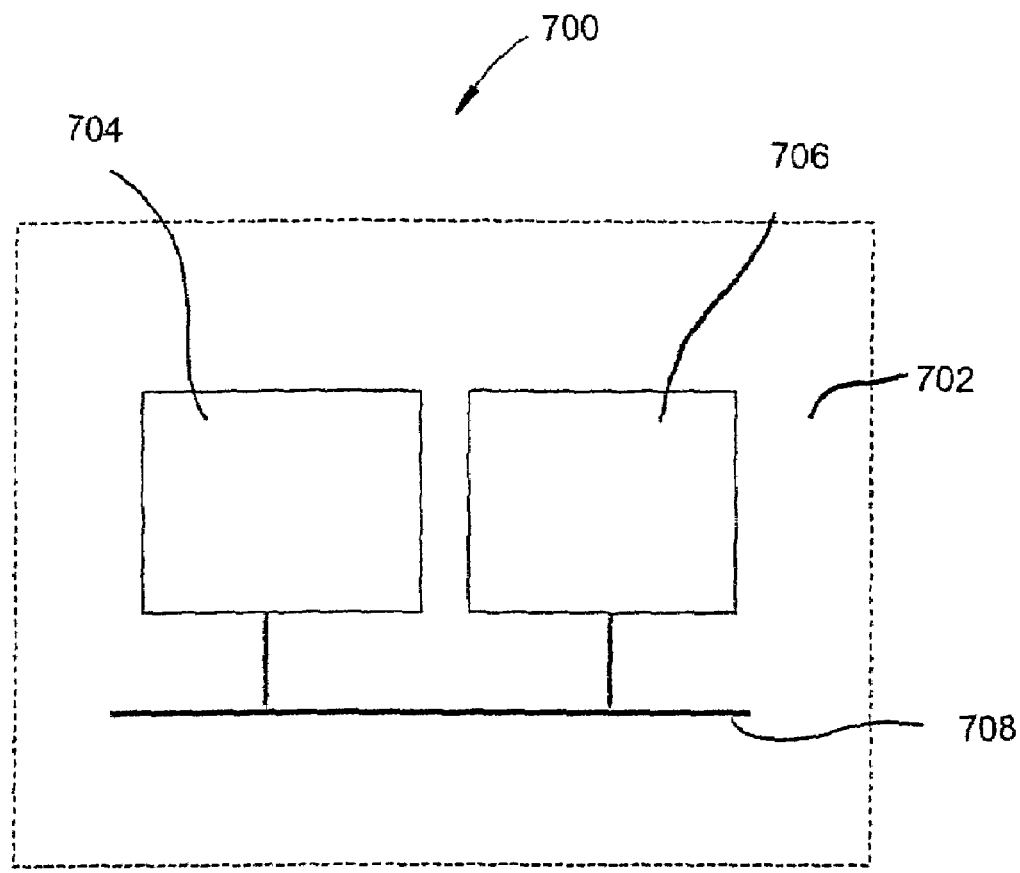
FIG. 7 is a schematic diagram of a computer system embodying the device shown in FIG. 1.

FIG. 7 shows a computer system 700 which embodies the memory device shown in FIG. 1. The computer system 700 has a main board 702 which is connected to a central processing unit 704 and magnetic memory device array 706. The magnetic memory device array 706 includes the device shown in FIG. 1. The magnetic memory device array 706 and the central processing unit 704 are connected to a common bus 708. The computer system 700 has a range of further components which are for clarity not shown.

Figure 8:
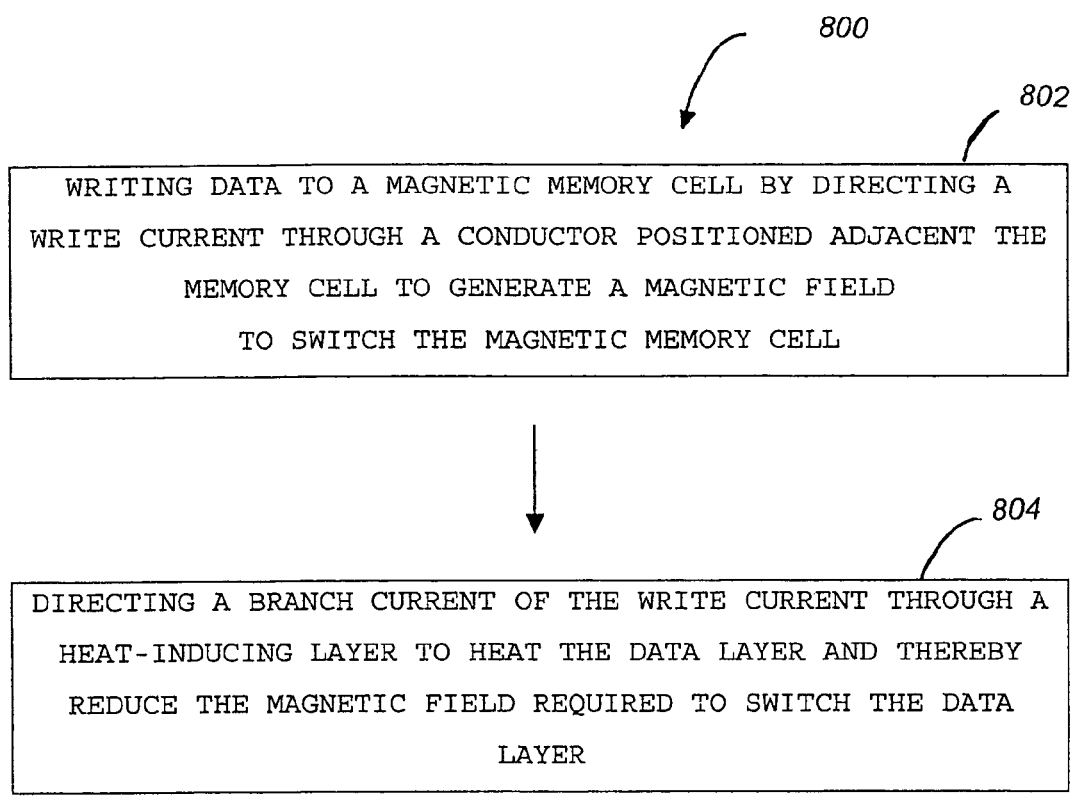
FIG. 8 is a flow-chart for a method in accordance with an embodiment of the present invention.

FIG. 8 illustrates a method embodiment of storing data in a magnetic memory device such as device 100 shown in FIG. 1. The method 800 includes the step 802 of writing data to the magnetic memory cell by using a write current directed through a conductor adjacent the magnetic memory cell to generate a magnetic field to switch the data layer. In step 804 a heat current is directed through a heat-inducing layer that is proximate to the magnetic memory cell and series connected with the magnetic memory cell. In this embodiment the heat current is a branch current of the write current. The heat-inducing layer effects heating of the magnetic memory cell to reduce the strength of the magnetic field needed to switch the data layer.

Although the embodiments have been described with reference to particular examples, it is to be appreciated by those skilled in the art that the embodiments may take other forms. For example, the magnetic memory cells may be colossal magneto-resistance memory cells (CMR) or giant magneto-resistance memory (GMR) cells. Further, at least one additional layer of insulating or conductive material may be disposed between the bit-line and the memory cell. The at least one additional layer may be disposed between the memory cell and the at least one heat-inducing layer or between the at least one heat-inducing layer and the bit line. In this case the magnetic memory cell may be electrically isolated form the bit and/or word lines.

For example, a sense conductor may be in electrical contact with the memory cell (ie with the data layer) and an electrically insulating layer may be disposed between the bit line and the sense layer. Also, if there are more than one additional insulating or conductive layers, at least one of the additional layers may be disposed between the heat-inducing layer and the memory cell and at least one of the additional layers may be disposed between the bit line and the heat-inducing layer. Further, it is to be appreciated that each magnetic memory cell may include a number of additional layers such as capping, AF and seed layers.

What is claimed is:

1. A magnetic random access memory (MRAM) device, comprising:
   a magnetic memory cell switchable between two states by the application of a magnetic field, the magnetic field for such switching being dependent in part on a memory cell temperature;
   at least one heater element proximate to the magnetic memory cell and series connected with the magnetic memory cell for heating of the magnetic memory cell; and
   a circuit for selectively applying the electrical current through the at least one heater element so as to heat the cell and facilitate cell state-switching.

2. The MRAM of claim 1, wherein:
   the at least one heater element is a heat-inducing layer.

3. The MRAM of claim 2 further comprising conductors coupled to the memory cell and, wherein:
   the at least one heat-inducing layer is positioned between a respective conductors and the memory cell.

4. The magnetic device of claim 3, wherein:
   the memory cell comprises a data layer and the at least one heat-inducing layers is positioned between the data layer and a respective conductors.

5. The MRAM of claim 1, wherein:
   in use the circuit applies the electrical current through the at least one heater element during a write operation of the magnetic memory cell.

6. The MRAM of claim 5, wherein:
   the circuit provides in use an electrical write-current that induces the magnetic field for switching the magnetic memory cell and the electrical current through the at least one heater element is a branch-current of the write-current.

7. The MRAM of claim 2, wherein:
   the at least one heat-inducing layer has a resistance that is greater than 50% of the resistance of the magnetic memory cell.

8. The MRAM of claim 7, wherein:
   the at least one heat-inducing layer has a resistance that is greater than the resistance of the magnetic memory cell.

9. The MRAM as claimed claim 2, wherein:
   the magnetic memory cell and at the at least one heat-inducing layer form a layered structure so that the electrical current passes through the heat-inducing layer and through the magnetic memory cell.

10. The MRAM of claim 2, wherein:
    the at least one heat-inducing layer is in contact with the memory cell.

11. The MRAM of claim 2, wherein:
    the memory cell comprises a data layer and a reference layer.

12. The MRAM of claim 11, further comprising:
    conductors coupled to the magnetic memory cell and comprising two heat-inducing layers, one heat-inducing layer being sandwiched between the data layer and a respective conductor and one being sandwiched between the reference layer and a respective conductor.

13. The MRAM of claim 2, wherein:
    the at least one heat-inducing layer is a layered structure.

14. The MRAM of claim 2, wherein:
    the at least one heat-inducing layer comprises an electrically resistive material.

15. The MRAM of claim 12, wherein:
    the resistive material comprises at least one of Si, Ge, Se, C, SiC, $HfO_2$, $ZrO_2$, AlO, TaSi, WSi, TiSi, TaN, TiN, TaSiN, WN and WSiN.

16. The MRAM of claim 12, wherein:
the resistive material comprises amorphous silicon.

17. The MRAM of claim 2, wherein:
the at least one heat-inducing layer is a dielectric layer that is sufficiently thin so that an electrical current can tunnel through the heat-inducing layer.

18. The MRAM of claim 14, wherein:
the at least one dielectric layer comprises at least one of aluminum oxide, aluminum nitride, silicon dioxide, silicon nitride and magnesium oxide.

19. The MRAM of claim 16, wherein:
the memory cell comprises a data layer and a reference layer and one dielectric layer is positioned between the data layer and a respective conductor.

20. The MRAM of claim 15 further comprising at least one further layer that comprises an electrically resistive material and in use provides an additional heat source.

21. The MRAM of claim 1 being a tunneling magneto-resistance (TMR) memory device.

22. The MRAM of claim 1 wherein the MRAM is one of an array of magnetic memory devices.

23. A computer system comprising:
a central processing unit,
a main board coupled to the central processing unit and magnetic memory devices coupled to the main board, each magnetic memory device comprising:
an array of magnetic memory cells; each cell being switchable between two states by applying a magnetic field, the magnetic field for such switching being dependent in part on a memory cell temperature;
heater elements proximate to a respective magnetic memory cells and series connected with the respective magnetic memory cell for heating of the respective magnetic memory cell; and
a circuit for selectively applying the electrical current through the each heater element so as to heat the respective cell and facilitate cell state-switching.

24. A method for storing data in a magnetic memory device, the device comprising a magnetic memory cell having a magnatisation switchable between two states by the application of a magnetic field, the magnetic field required for such switching being dependent in part on a memory cell temperature, the device further comprising a heater element located in the proximity of a magnetic memory cell and electrically series connected with the magnetic memory cell, the method comprising the step of:
writing data to the magnetic memory cell by using a write current to generate a magnetic field to switch the data layer and
directing a heat current through the heater element to heat the data layer to reduce the magnetic field required to switch the data layer.

25. The method of claim 24, wherein:
the heater element is a heat-inducing layer, the step of writing data to the magnetic memory cell comprises directing the write current through a conductor adjacent to the heater element and wherein the heat current is a branch current of the write current.

* * * * *